United States Patent [19]

Yuasa et al.

[11] Patent Number: 5,223,687

[45] Date of Patent: Jun. 29, 1993

[54] METHOD OF FORMING ELECTRODE PATTERN

[75] Inventors: Kimihiro Yuasa; Kenji Hashimoto, both of Sodegaura, Japan

[73] Assignee: Idemitsu Kosan Co., Ltd., Tokyo, Japan

[21] Appl. No.: 753,053

[22] Filed: Aug. 30, 1991

[30] Foreign Application Priority Data

Sep. 3, 1990 [JP] Japan ................. 2-230648

[51] Int. Cl.$^5$ .............................. B23K 11/22
[52] U.S. Cl. .................................. 219/68
[58] Field of Search ............... 219/68, 69.17, 69.1, 219/69.15; 204/129.3; 29/847; 437/170, 171, 172

[56] References Cited

U.S. PATENT DOCUMENTS

| | | | |
|---|---|---|---|
| 2,680,184 | 6/1954 | Cox | 219/69.17 |
| 3,119,919 | 1/1964 | Pratt | 219/68 |
| 3,305,666 | 2/1967 | Zaromb | 219/68 |
| 3,649,801 | 3/1972 | Cardell et al. | 219/68 |
| 4,634,826 | 1/1987 | Solomon et al. | 219/68 |
| 4,931,613 | 6/1990 | Salsgiver et al. | 219/68 |
| 5,090,121 | 2/1992 | Gaddis | 219/69.17 |

FOREIGN PATENT DOCUMENTS

| | | | |
|---|---|---|---|
| 0421429 | 10/1991 | European Pat. Off. | |
| 56-163843 | 12/1981 | Japan | 219/69.14 |
| 475094 | 10/1979 | U.S.S.R. | 437/172 |

OTHER PUBLICATIONS

Japan Patent Abstract of Japan Patent document 63-18330, Section P., vol. 12, No. 224, Jun. 25, 1988.

Primary Examiner—Geoffrey S. Evans
Attorney, Agent, or Firm—Antonelli, Terry, Stout & Kraus

[57] ABSTRACT

A method of forming a pattern in a conductive film of the group consisting of indium oxide film, indium tin oxide film, and aluminum film, covering a surface of a substrate of glass or a plastic material. This is accomplished by contacting a metal electrode with the surface of the substrate, and moving the area where the electrode contacts the conductive film at a speed of 5 to 1000 mm/sec while a voltage of 5 to 60 volts is applied between the electrode and the film.

10 Claims, 1 Drawing Sheet

METHOD OF FORMING ELECTRODE PATTERN

BACKGROUND OF THE INVENTION (a) Field of the Invention

The present invention relates to a method of forming an electrode pattern in an electrode layer which is used in liquid crystal optical devices, touch panels, EL elements, or the like.

(b) Description of the Related Art

In the conventional method of forming an electrode pattern, there has generally been employed photolithography technique where an electrode pattern is formed by carrying out sequential steps including coating a conductive film covering a substrate with a photoresist, placing a circuit pattern film thereon, printing the pattern onto the photoresist by exposure, etching the conductive film in the areas other than the areas under the developed pattern of the photoresist, and removing the developed pattern of the photoresist. However, this method includes many steps, and development and etching are liable to go amiss when a fine pattern is formed in a conductive film of a large area, thereby decreasing the yield.

As a means of dissolving the problem, in Japanese Patent Application Kokai Koho (Laid-open) No. 63-18330, there is proposed a method where a laser beam is applied to a conductive film in vacuum to remove the conductive film in the areas where the laser beam is applied. This method, however, also involves some problems. For example, scalping up of equipments is inevitable because of the necessity for applying a laser beam in vacuum, and high power sources of laser beam and the optical system for moving the areas applied with the laser beam are very expensive. Furthermore, when plastic substrates are used, destruction is not limited in conductive films on the plastic substrates but extends into the plastics substrates.

SUMMARY OF THE INVENTION

An object of the present invention is to provide a method of forming an electrode pattern, which can largely reduce the number of steps in forming an electrode pattern, thereby increasing the yield, can be performed by using simplified equipments with a decreased cost and enables the production of fine electrode patterns of large areas.

As the results of the inventor's diligent research, they found that the object can be achieved by removing the unnecessary area of a conductive film by means of etching using an electric current, and the finding led them to complete the present invention.

That is, the present invention provides a method of forming an electrode pattern in a conductive film covering a surface of a substrate, comprising:

making a metal electrode for etching contact the conductive film at an area on an exposed surface of the conductive film; and moving the area where the metal electrode for etching contacts with the conductive film while a voltage is applied between the metal electrode for etching and the conductive film to remove the conductive film at and in the vicinity of the area where the metal electrode for etching contacts the electrode film and form an electrode pattern in the conductive film.

DESCRIPTION OF THE PREFERRED EMBODIMENTS

The preferred examples of the conductive film which is formed into a patterned electrode by the present invention are those having transparency, such as indium oxide (NESA) film and indium tin oxide (ITO) film. Various kinds of metal films, such as aluminum film or magnesium film, and organic conductive films may also be used. From the view point of the easiness in patterning using an electric current, the conductive film preferably has a surface resistivity of 1 to 2,000 $\Omega/\square$. The thickness of the conductive film is preferably 10 nm to 1 $\mu$m. When the thickness of the conductive film is less than 10 nm, the substrate under the conductive film may be scarred by the tip of the metal electrode for etching. When the conductive film is thicker than 1 $\mu$m, reduction of the moving speed of the contacting area between the metal electrode for etching and the conductive film may become necessary for the removal of the conductive film, thereby causing a decrease in the productivity.

In the present invention, the substrate covered by the conductive film may be any kind of substrate generally used in this art, such as a glass substrate or a plastic substrate.

The method of coating the substrate with the conductive film may be any known method, for example, deposition technique, spattering technique, or coating technique.

Commercially available substrates covered with conductive films, such as glass substrates covered with ITO films, glass substrates covered with NESA films, and plastic substrates covered with ITO films, may be suitably used in the method of forming an electrode pattern according to the present invention.

Figure 1:
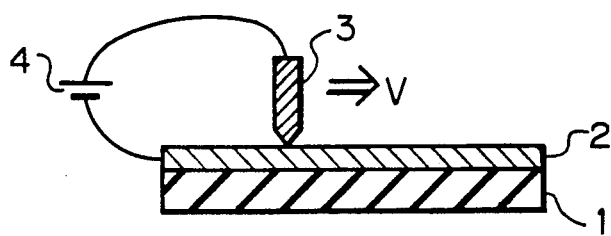
FIG. 1 is a sectional view illustrating an embodiment of the method of forming an electrode pattern according to the present invention.

FIG. 1 is a sectional view illustrating an embodiment of the method of forming an electrode pattern according to the present invention.

In the method of forming an electrode pattern according to the present invention, a metal electrode for etching 3 is made to contact a conductive film 2 covering a surface of a substrate 1, and an voltage is applied between the metal electrode for etching 3 and the conductive film 2 to remove the conductive film 2 at and in the vicinity of the area where the metal electrode for etching 3 contacts the conductive film 2. While the voltage is applied, the contacting area between the metal electrode for etching 3 and the conductive film 2 is moved to form an electrode pattern in the conductive film 2.

The metal electrode for etching is used to make an electric contact between the metal electrode for etching and the conductive film.

Since the contacting area between the metal electrode for etching and the conductive film is generally small in area, the current density is high at the contacting area, so that Joule heat is generated. The conductive film is etched and removed by the repetition of the generation of Joule heat and electric discharge.

The material of the metal electrode for etching is not particularly limited so far as it does not crack or change shape during the removal of the conductive film. Generally, almost all metals, such as iron, aluminum, gold, silver and copper, and various kinds of alloys may be used without any problems.

The shape and size of the metal electrode for etching are not particularly limited, but when a fine pattern is formed, it is preferable to use a metal electrode for etching which has a needle-like tip and contacts the conductive film in an area of 1 mm$^2$ or less.

Figure 2:
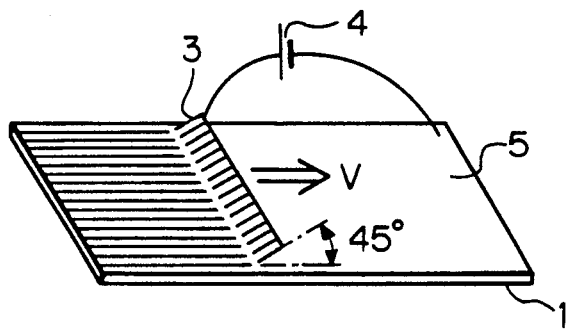
FIG. 2 is a perspective view illustrating an embodiment of the method of forming an electrode pattern according to the present invention which was carried out in Example 1.
Figure 3:
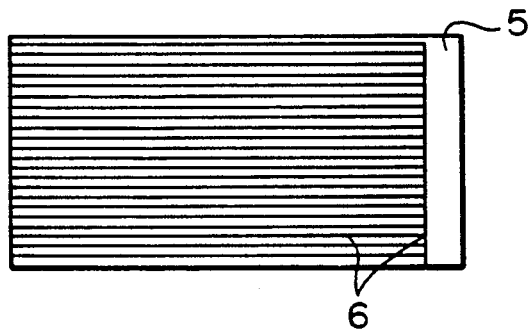
FIG. 3 is a plane view of the electrode film which was patterned in Example 1.

A plurality of metal electrodes for etching may be used simultaneously, and one metal electrode for etching having a plurality of tips for contacting the conductive film at a plurality of areas also may be used. The latter type of a metal electrode for etching makes it easy to form a plurality of line patterns simultaneously. In FIG. 2 and FIG. 3, an example of the latter type of metal electrode for etching is shown. The metal electrode for etching has a comb-like shape where a plurality of needle-like metal teeth extend in parallel from a metal axis for connecting all the metal teeth.

The means of making the metal electrode for etching contact the conductive film is not particularly limited so far as the means ensures an electric contact therebetween. The contacting pressure also is not particularly limited, and generally, a pressure made by the weight of the metal electrode for etching is sufficient for the electric contact. The preferred contacting pressure is 100 g/mm$^2$ or less since an extremely high contacting pressure might injure the substrate under the conductive film. When a flexible substrate, such as a plastic substrate, is used, it is preferable to give proper tension to the substrate to make stable contact between the metal electrode for etching and the conductive film.

In order to make the movement of the contacting area smooth, the metal electrode for etching may be inclined to the direction in which the contacting area with the conductive film moves. Metal electrodes for etching the tips of which are rounded off, for example metal electrodes for etching having round tips, do not need to be inclined.

The preferred range of the voltage applied between the metal electrode for etching and the conductive film is 5 to 60 V. A voltage lower than 5 V may result in insufficient etching which causes undesired continuity in the obtained patterned electrodes. On the contrary, a voltage higher than 60 V may extend the width of the etched area unnecessarily. The particularly preferred range of the voltage is 10 to 40 V.

Generally, the smaller the surface resistivity of the conductive film is, the smaller the voltage required for etching is.

The preferred wave form of the applied voltage is a direct current, an alternating or a combination thereof. A direct current voltage is sufficient for general purposes. When the voltage is an alternating current voltage, even complicated patterns, such as patterns including dotted lines, can be made easily by the mere movement of the contacting area between the metal electrode for etching and the conductive film.

By applying the voltage as described above between the metal electrode for etching and the conductive film, the conductive film at or in the vicinity of the contacting area between the metal electrode for etching and the conductive film is etched and removed. The removed conductive film evaporates or scatters in the air in a form of fine particles. Therefore, it is preferable to wash the substrate bearing the patterned electrode after the completion of etching. Since the purpose of washing is the mere removal of the scattered fine particles, simple washing, for example washing with air-blowing or water, is sufficient.

Although the size of the area where the conductive film is removed depends upon the etching conditions including the surface resistivity and thickness of the conductive film, applied voltage and the moving speed of the area where the metal electrode for etching contacts the conductive film, it generally extends several $\mu$m to 10 $\mu$m around the contacting area. In general, the more the applied voltage is reduced, the more the area where the conductive film is removed is decreased.

The lower the applied voltage is and the faster the moving speed of the contacting area is, the sharper the shape of the etched section caused by the removal of the conductive film by etching is.

The contacting area between the metal electrode for etching and the conductive film is moved to follow a predetermined pattern, so that the area of the conductive film unnecessary for the desired electrode pattern is removed.

The use of a proper moving stage is suitable for moving the contacting area between the metal electrode for etching and the conductive film. For example, X-Y stages enable the formation of complicated electrode patterns.

The preferred moving speed of the contacting area is 5 to 1,000 mm/sec. A moving speed of less than 5 mm/sec may drop the productivity, and a moving speed of more than 1,000 mm/sec may cause insufficient etching. The particularly preferred moving speed is 10 to 300 mm/sec.

Since, in the method of the present invention, as described above, etching with electric current is employed for the removal of unnecessary area of a conductive film to form an electrode pattern, the method includes few steps and the yield is high. Further, simple equipments are enough for the method, with costs of production lowered. In addition, the method enables easy formation of an electrode pattern in an electrode of a large area or easy formation of a fine electrode pattern.

The electrode which is patterned as described above is suitably used as a driving electrode in various instruments, for example, liquid crystal optical devices, touch panels and EL elements, together with other components, such as liquid crystal materials and opposite electrodes.

The present invention will be described in more detail with reference to the following Examples. These Examples, however, are not to be construed to limit the scope of the invention.

EXAMPLES 1 TO 3

EXAMPLE 1

In the manner as shown in FIG. 2, a striped electrode pattern was formed by using a substrate 1 (glass plate:

300 mm in width, 400 mm in length, 0.8 mm in thickness) covered with an ITO film 5 having a surface resistivity of 20 $\Omega/\square$ and a thickness of 100 nm and etching the ITO film by the method according to the present invention.

The etching of the ITO film was carried out in the manner as shown in FIG. 2. The metal electrode for etching 3 used in this Example was made of iron and had a comb-like shape where 250 needle-like teeth extended in parallel at intervals of 1/20 inches (about 1.27 mm) from an axis for connecting all the teeth, each tooth being 0.5 mm in diameter and 10 mm in length and having a spherical tip of 100 $\mu$m in diameter.

The spherical tips were made to contact the exposed surface of the ITO film 5 at the left edge of the substrate 1, and a voltage supplied from a power source 4 was applied between the comb-like metal electrode for etching 3 and the ITO film 5 to remove the ITO film 5 at and in the vicinity of the areas where the comb-like metal electrode for etching 3 contacts the ITO film 5. During application of the voltage, the comb-like metal electrode for etching 3 was moved in the longitudinal direction of the substrate 1 while a load of about 200 g was applied to the comb-like metal electrode for etching 3. The voltage applied between the comb-like metal electrode for etching 3 and the ITO film 5 was a direct current of 30 V, and the moving speed of the comb-like metal electrode for etching 3 was 400 mm/sec. The comb-like metal electrode 3 being in contact with the ITO film 5 was inclined to its moving direction so that the needle-like teeth and the surface of the ITO film 5 made an angle of 45°. The inclined comb-like metal electrode for etching 3 made the movement of the contacting areas smooth.

The etching process decribed above was completed in about one minute.

The movement of the comb-like metal electrode for etching 3 was stopped 1 cm short of the un-etched edge of the substrate 1 (in FIG. 2, the right edge), and the comb-like metal electrode for etching 3, subsequently, was moved several centimeters in a right angle to the previous moving direction, namely in the width direction of the substrate 1 (in FIG. 2, to the lower right on the substrate 1).

Thus formed electrode pattern, as shown in FIG. 3, comprised etched lines 6 in a form of parallel stripes, which extended from the left edge of the substrate 1 to the longitudinal direction 1 cm short of the right edge of the substrate 1, and an etching line 6 which connected the right ends of the striped etching lines 6 in a right angle and extended to the width direction of the substrate 1.

The patterned electrode was tested for continuity, and continuity was not obtained at the clocked area because the ITO film was removed completely at the etched area. After an observation of the patterned electrode by an electromicroscope, it was found that the edge of the etched section was satisfactorily sharp and the gap between each couple of electrode lines next to each other was about 30 $\mu$m.

EXAMPLE 2

Figure 4:
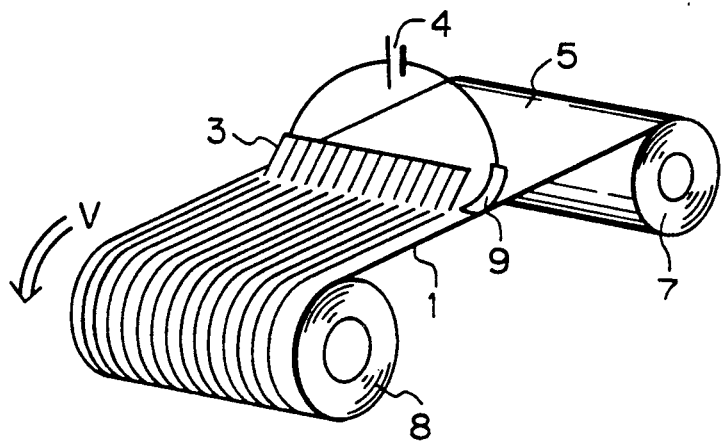
FIG. 4 is a perspective view illustrating another embodiment of the method of forming an electrode pattern according to the present invention which was carried out in Example 2.

In the manner as shown in FIG. 4, a striped electrode pattern was formed continuously by using a PES substrate 1 (polyethersulfone substrate, produced by Sumitomo Bakelite Co., Ltd., Trademark: FST, 300 mm in width, 50 m in length, 100 $\mu$m in thickness) covered with an ITO film 5 having a surface resistivity of 300 $\Omega/\square$ and a thickness of 50 nm and etching the ITO film 5 while the substrate 1 was moved at a uniform speed.

As shown in FIG. 4, the ITO film 5 was etched while the substrate 1 covered with the ITO film 5 was supplied from a supply roll 7 which had been wound with the substrate 1, moved at a uniform speed v and was wound up on a winding roll 8. The same comb-like metal electrode for etching 3 as that used in Example 1 was used. The anode of a power source 4 was connected to the metal electrode for etching 3, the cathode to an opposite electrode 9, which was made in contact with the surface of the ITO film 5, and a voltage was then applied between the metal electrode for etching 3 and the ITO film 5. The opposite electrode 9 was a copper plate of 10 mm in width, which ensured constant application of a uniform voltage. The moving speed of the substrate 1, v, was 500 mm/sec, the tension given to the substrate 1 was 1 kg, and the load applied to the metal electrode for etching 3 was 300 g. The applied voltage was a direct current voltage of 40 V.

The etching of the ITO film 5 of 50 m in full length was completed in about 100 seconds, with high speed productivity proved.

The obtained patterned electrode was of good quality without any deficiencies. The edge of the etched section was satisfactorily sharp and the gap between each couple of electrode lines next to each other was 70 $\mu$m.

EXAMPLE 3

A striped electrode pattern was formed by using the same apparatus as that used in Example 2 and a PET substrate (polyethylene terephthalate substrate, produced by PANAC INDUSTRIES, INC., Trademark: METALMEE: 450 mm in width, 10 m in length, 100 $\mu$m in thickness) covered with an deposited aluminum film having a surface resistivity of 0.1 $\Omega/\square$ and a thickness of 100 nm.

The moving speed of the substrate, v, was 300 mm/sec, the tension given to the substrate was 1.5 kg, and the load applied to the metal electrode for etching was 250 g. The applied voltage was a direct current voltage of 15 V.

The etching of the deposited aluminum film was completed in about 30 seconds. After an observation of the etched area by an optical microscope, it was found that the gap between each couple of electrode lines next to each other was about 100 $\mu$m.

When the applied voltage was altered to a direct current voltage of 20 V, the gap between each couple of electrode lines next to each other was about 150 $\mu$m. When the applied voltage was altered to a direct current voltage of 10 V, the gap was 60 $\mu$m. The lower the applied voltage was, the sharper the etched section was.

What is claimed is:

1. A method of forming an electrode pattern in a conductive film covering a surface of a substrate, comprising:

causing a metal electrode for etching to contact the conductive film covering a surface of the substrate at an area on an exposed surface of the conducting film, the metal electrode for etching having a needle-like tip, the conductive film being selected from the group consisting of an indium oxide film and an indium tin oxide film, the substrate being made of a plastic material, and the conductive film covering the surface of the substrate having a surface resistivity of 1 to 2,000 $\Omega/\square$; and moving the area where the metal electrode for etching contacts the conductive film at a speed of 5 to 1,000 mm/sec while a voltage of 5 to 60 V is applied between the metal electrode for etching and the conductive film to remove the conductive film at and in the vicinity of the area where the metal electrode for etching contacts the conductive film and to form an electrode pattern in the conductive film.

2. The method as claimed in claim 1, wherein the conductive film has a thickness of 10 nm to 1 μm.

3. The method as claimed in claim 1, wherein the conductive film is a conductive film having transparency.

4. The method as claimed in claim 1, wherein the substrate is a flexible substrate.

5. The method as claimed in claim 1, wherein the metal electrode for etching is made of a metal selected from the group consisting of iron, aluminum, gold, silver, copper and an alloy.

6. The method as claimed in claim 1, wherein the metal electrode for etching has a plurality of needle-like tips for contacting the conductive film at a plurality of areas on the exposed surface of the conductive film.

7. The method as claimed in claim 1, further comprising washing the substrate having the electrode pattern after completion of the etching to remove scattered fine particles of the conductive film formed during etching.

8. The method as claimed in claim 1, wherein the conductive film has a thickness of 10 nm to 1 μm, and the metal electrode for etching is made of a metal selected from the group consisting of iron, aluminum, gold, silver, copper and an alloy.

9. The method as claimed in claim 8, wherein the metal electrode for etching has a plurality of needle-like tips for contacting the conductive film at a plurality of areas on the exposed surface of the conductive film.

10. The method as claimed in claim 8, further comprising washing the substrate having the electrode pattern after completion of the etching to remove scattered fine particles of the conductive film formed during etching.

* * * * *